(12) United States Patent  
Kim et al.

(10) Patent No.: US 9,197,402 B2
(45) Date of Patent: Nov. 24, 2015

(54) RE-CIRCULATING TIME-TO-DIGITAL CONVERTER (TDC)

(75) Inventors: Hyung Seok Kim, Portland, OR (US); Ashoke Ravi, Hillsboro, OR (US); William Y. Li, Portland, OR (US); Kailash Chandrashekar, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 13/997,229

(22) PCT Filed: Apr. 10, 2012

(86) PCT No.: PCT/US2012/032933
§ 371 (c)(1),
(2), (4) Date: Jul. 14, 2014

(87) PCT Pub. No.: WO2013/154543
PCT Pub. Date: Oct. 17, 2013

(65) Prior Publication Data
US 2014/0333358 A1    Nov. 13, 2014

(51) Int. Cl.
*H03M 1/48* (2006.01)
*H04L 7/033* (2006.01)
*H03L 7/197* (2006.01)
*G04F 10/00* (2006.01)

(52) U.S. Cl.
CPC ............ *H04L 7/0331* (2013.01); *G04F 10/005* (2013.01); *H03L 7/1974* (2013.01)

(58) Field of Classification Search
USPC .................. 341/155, 144, 118, 120, 110, 111
See application file for complete search history.

(56) References Cited

U.S. PATENT DOCUMENTS 8,207,770 B1 * 6/2012 Ravi et al. ...................... 327/159
8,429,487 B2 * 4/2013 Chang et al. .................. 714/752

(Continued)

FOREIGN PATENT DOCUMENTS

JP    2002-076886 A    3/2002

OTHER PUBLICATIONS

International search Report and Written Opinion received for PCT Patent Application No. PCTIUS2012/032933, mailed on Aug. 19, 2013, 11 pages.

*Primary Examiner* — Peguy Jean Pierre
(74) *Attorney, Agent, or Firm* — Thorpe North & Western LLP

(57) ABSTRACT

A re-circulating time-to-digital converter (TDC) can include a triggered reference ring oscillator (TRRO) and a delay module. The triggered reference ring oscillator can, when triggered by a reference signal edge, generate a periodic ring oscillator signal with a ring oscillator period that is a selected ratio of a voltage-controlled oscillator (VCO) period. The delay module can store, in a plurality of latches, samples of a VCO signal docked by the periodic ring oscillator signal. Each latch can generate an output of the sample, and each latch output can represent a time difference polarity between VCO signal and TRRO signal. In another example, the re-circulating TDC can include the triggered reference ring oscillator, a digital frequency lock module, and a TDC post-process module. The digital frequency lock module can generate a ring oscillator control signal, which sets the ring oscillator period for the triggered reference ring oscillator. The TDC post-process module can generate a TDC output, which can be a binary representation of a phase difference between a reference signal and a VCO signal.

30 Claims, 10 Drawing Sheets

(56) References Cited

U.S. PATENT DOCUMENTS

| | | | |
|---|---|---|---|
| 8,558,728 B1 * | 10/2013 | Lemkin et al. | 341/166 |
| 8,773,182 B1 * | 7/2014 | Degani et al. | 327/156 |
| 8,878,614 B2 * | 11/2014 | Yin et al. | 331/25 |
| 2003/0098731 A1 | 5/2003 | Tabatabaei et al. | |
| 2009/0163166 A1 | 6/2009 | Lin | |
| 2009/0251225 A1 | 10/2009 | Chen et al. | |
| 2011/0309888 A1 | 12/2011 | Bulzacchelli et al. | |

* cited by examiner

RE-CIRCULATING TIME-TO-DIGITAL CONVERTER (TDC)

BACKGROUND

Many electronic devices operate off a periodic clock signal to synchronize the transmission of data between electronic components within the device. Periodic clock signals can be provided by an oscillator, such as voltage controlled oscillator (VCO). Periodic clock signals are also used in radio devices and wireless devices to generate specified frequencies that can be used for a variety of purposes including upconversion, downconversion, and transmission on a carrier frequency. A wireless communication device may be allocated a specified range of frequency bands in which data is transmitted. A VCO can be used in a phase-locked loop (PLL) to generate various frequency bands. A time-to-digital converter (TDC) can be used in a phase-locked loop (PLL) to lock the frequency of the VOC to specified frequency.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Figure 1:
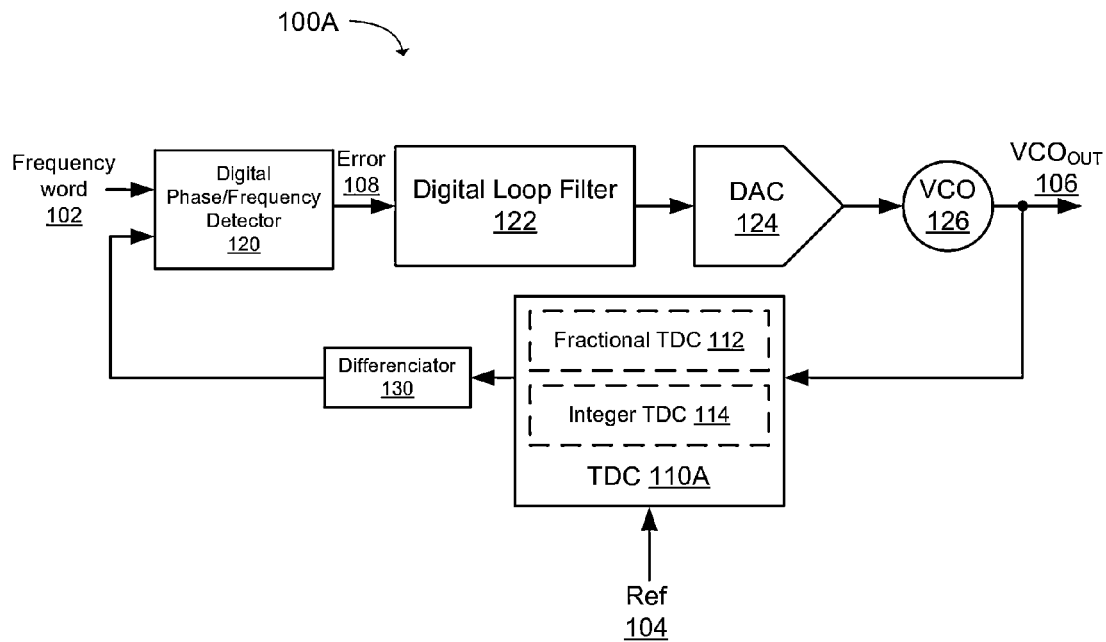
FIG. 1 illustrates a block diagram of an all-digital phase locked loop (ADPLL) in accordance with an example.

Reference will now be made to the exemplary embodiments illustrated, and specific language will be used herein to describe the same. It will nevertheless be understood that no limitation of the scope of the invention is thereby intended,

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence, Example Embodiments An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

Figure 2:
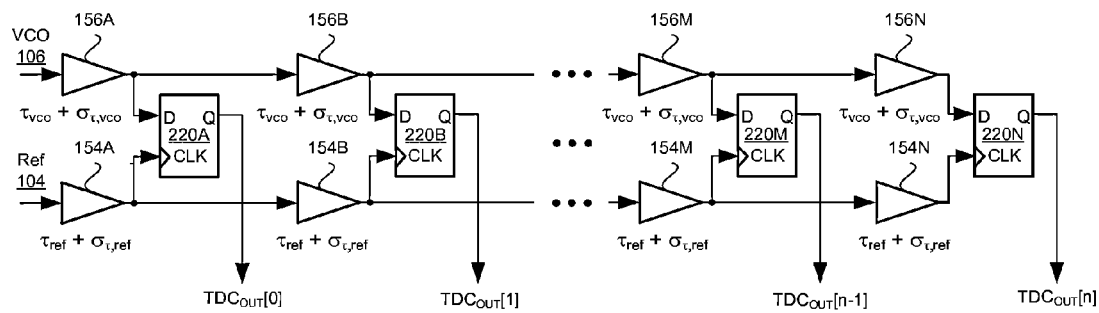
FIG. 2 illustrates a block diagram of a Vernier time-to-digital converter (TDC) in accordance with an example.

For an all-digital phase locked loops (ADPLLs), a time-to-digital converter (TDC) can be used for converting phase information of a voltage-controlled oscillator (VCO) into a digital domain. FIG. 1 illustrates an ADPLL 100A architecture suitable for fractional-n operation which can include a TDC 110A. The TDC may include a fractional TDC 112 (e.g., a Vernier TDC) and an integer TDC 114. In order to achieve the sub-gate-delay resolution used in many wireless standards, the TDC may be implemented as a delay Vernier. The Vernier TDC can be analogous to a flash analog-to-digital converter but operating in the time domain. As shown in FIG. 2, the Vernier TDC can include delay cells 156A-B, 156M-N, 154A-B, and 154M-N and sampling flip-flops (FF) 220A-B and 220M-N. The Vernier TDC can include an n number of FF and an 2n number of delay cells or delay elements. The output of the plurality of the FFs can generate a different output with each triggering edge of the reference signal. The TDC resolution can determined by a difference between the VCO delay ($\tau_{vco}$) of the VCO signal 106 and the reference delay ($\tau_{ref}$) of the reference signal (REF) 104 and the FFs can perform a time comparison. However, due to variations ($\sigma_{\tau,vco}$ and $\sigma_{\tau,ref}$) in the delay cells as well as setup hold time variations in the FFs, the Vernier TDC can have nonlinear characteristics. The variations can create low-frequency tones and cause noise folding, which can increase the phase noise at an ADPLL output. To reduce the nonlinearity due to variations, the TDC delay cells may be matched together, such as delay cell 156A for the VCO signal matched with the delay cell 156B,M,N for the VCO signal, and delay cell 154A for the reference signal matched with the delay cell 154B,M,N for the reference signal. In order to reduce non-linearities from the mismatch of delay cells, the delay cells in the Vernier TDC may be sized up (where the component's features and process dimensions are larger than other similar components using the same process), which can lead to a large area and high power consumption for the TDC. As a result, the TDC may occupy a relatively large area of a silicon die and consume a relatively large amount of power, becoming a power-hungry block of a circuit. Moreover, the Vernier TDC does not scale well with process scaling, like other digital circuits, due to a need to maintain adequate matching between the delay cells. Consequently, the power dissipation and area overhead can become a bottleneck to scaling. A re-circulating TDC can provide a scaling compatible, low-power, and mismatch and process, voltage and temperature (PVT) insensitive TDC.

The nonlinearity of TDCs, such as a Vernier TDC, can be corrected by dithering. The amount of dithering can be set by an integral non-linearity (INL) of the TDC. Since the TDC can span at least one complete VCO period in fractional-n synthesizers, the number of delay stages or delay elements in high resolution TDCs can be large. The number of delay stages can have the effect of worsening the INL. The amount of dithering used to linearize the TDC can then increase the white noise level in the PLL defeating an objective of attaining lower phase noise through increased TDC resolution. White noise can be a random signal (or process) with a flat power spectral density. In other words, the white noise can contain equal power within a fixed bandwidth at any center frequency. Another process to correct the nonlinearity of TDCs can be using digital back-end calibration. In digital backend calibration, TDC non-linearity can be measured and then the non-linearity can be calibrated digitally. However, digital back-end calibration can use a memory and complex digital back-end calibration circuits also resulting in relatively large silicon area. In addition, digital back-end calibrations can be sensitive to temperature drifts and supply changes and may not be practical to implement in devices with specified or rigid standards, where the devices may be always connected, such as cellular receivers.

A re-circulating TDC and an associated method can be used to provide time-to-digital conversion with reduced TDC non-linearity. The re-circulating TDC can provide an area efficient, low-power, scalable TDC with reduced process, voltage and temperature (PVT) variation sensitivity. In an example, the re-circulating TDC can reuse a single delay cell and sampling flip-flop for the time comparison. In another example, the delay cell can be configured as a triggered ring oscillator with a fixed period which can be slightly shorter than VCO period. Through reusing the delay cell the TDC can achieve linear characteristics with a much smaller area and power consumption compared with a conventional TDC, such as the Vernier TDC. In another configuration, the frequency locking used for the triggered ring oscillator period adjustment can be performed in digital domain and thus the triggered ring oscillator period adjustment can be automatically calculated and routed to the triggered ring oscillator. In another example, the embedded counting system of the TDC can minimize the power consumption and area overheads of a frequency locking mechanism.

Figure 3A:
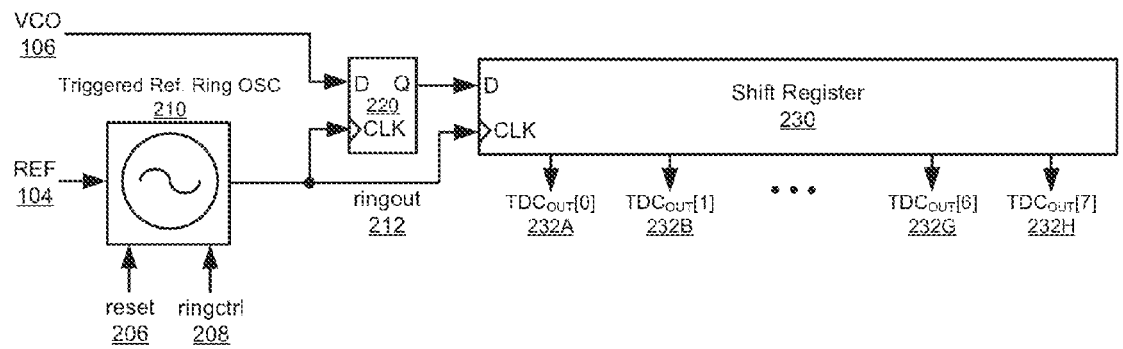
FIG. 3A illustrates a block diagram of a triggered reference ring oscillator for a re-circulating time-to-digital converter (TDC) in accordance with an example.

The following provides additional details of the examples. In an example, the re-circulating TDC can re-use a single delay cell and flip-flops (FF). FIG. 3A illustrates an example of the re-circulating TDC. For simplicity of illustration, the re-circulating TDC can comprise a 3-bit re-circulating TDC. The re-circulating TDC can include a triggered reference ring oscillator 210 (Ref. Ring OSC), a latch 220 (e.g., a FF), and a delay module (e.g., a shift register 230). The triggered reference ring oscillator can include an enabled control input, a reset 206 control input, and ringctrl 208 control input. A latch, such as a flip-flop, can be a circuit that has two stable states. The latch can be used to store state information. The latch can be made to change state by signals applied to one or more control inputs and the latch can have one or two outputs. Latches can be used as data storage elements. Edge-triggered latches can be clocked by an edge of a control input. A data or delay flip-flop (D flip-flop) can have an input D, a control clock input clk, an output Q. The latch or flip-flop may also include a control set/reset input. A shift register can include a cascade of latches, such as flip flops, sharing a same clock, which can have an output of any one of the latches but the last latches connected to the "data" (D) input of the next one in a chain. The shift register can provide a state value (e.g., a logic low, a logic high, a digital "0", or a digital "1") that shifts by one position in a one-dimensional "bit array" stored in the circuit. The shift register can shift in the data present at the shift register input and shifting out the last bit in the array, when enabled to do so by a transition of the clock input. Shift registers can have both parallel and serial inputs and outputs. Although, latches, flip-flops, and shift registers are specifically described, other circuits performing the same function described herein may also be used.

Figure 3B:
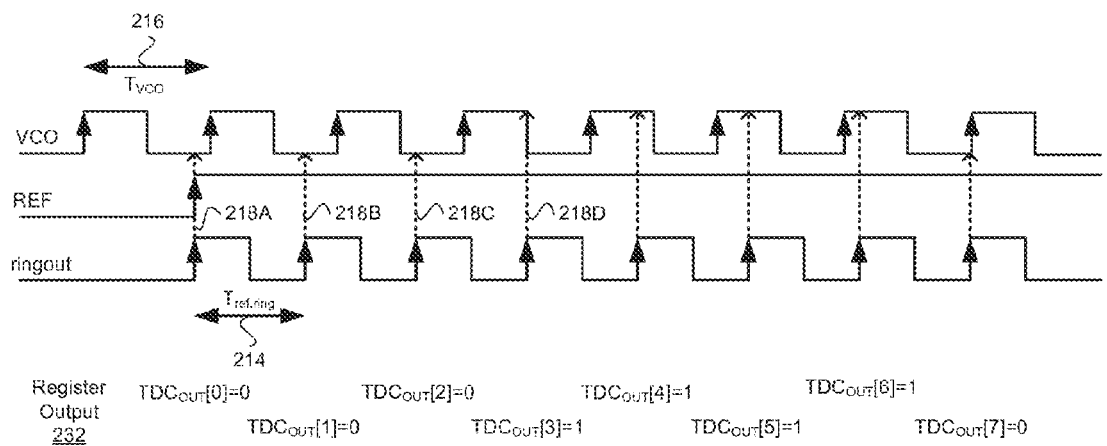
FIG. 3B illustrates a timing diagram of sampling a voltage-controlled oscillator (VCO) signal using a periodic ring oscillator signal of a triggered reference ring oscillator in accordance with an example.

In an example, when the reference signal REF 104 transitions from low to high, the triggered Ref. Ring OSC 210 starts oscillating generating a periodic ring oscillator signal 212. The periodic ring oscillator signal with a ring oscillator period can be a selected ratio of a voltage-controlled oscillator (VCO) period $T_{vco}$ 216, as illustrated in FIG. 3B. For example, if the period of the Ref. Ring OSC, $T_{ref\_ring}$ 214, is set to $(7/8)T_{vco}$, the time difference between the VCO signal 106 rising edge and the Ref. Ring OSC signal rising edge decreases by $(1/8)T_{vco}$ every cycle. The FF may be clocked by the rising edge of the periodic ring oscillator signal (e.g., an output ringout 212 of triggered Ref. Ring OSC), which can store a sample of the VCO signal. The FF 220 compares the VCO phase with the output ringout of triggered Ref. Ring OSC rising edge and the FF output is stored in the shift register as a sample and the sample value or state value shifts within the shift register for different sequential time intervals. Each FF output can represent a time difference polarity between the VCO signal and the periodic ring oscillator signal. For example, at a first ringout rising edge 218A, the shift register output [$TDC_{OUT[0]}$=0] can store a logic low. At a second ringout rising edge 218B, the shift register output [$TDC_{OUT[1]}$=0] can store a logic low. At a third ringout rising edge 218C, the shift register output [$TDC_{OUT[2]}$=0] can store a logic low. At a fourth ringout rising edge 218D, the shift register output [$TDC_{OUT[3]}$=1] can store a logic high, and so on. After the eighth (8th) cycle of the Ref. Ring OSC, the triggered reference ring oscillator and the ringout can be disabled and the output 232A-H of the shift register can be maintain until the next REF rising edge. In the example illustrated in FIG. 3B, the shift register output is 00011110. By finding high to low transition, the phase of the VCO signal relative to the reference signal can be decoded. In HG. 3B, the position of the high to low transition is 6. The transition can represent $(6/8)T_{vco}$ time difference between the VCO and REF rising edge. The TDC can be linear, which can be minimally affected by random thermal/flicker noise. Since the Ref. Ring OSC can be reset after a pre-determined number of cycles (e.g., 8 cycles in FIG. 3B), the oscillator may not be free running oscillator. Therefore the phase noise of the oscillator may not accumulate indefinitely as in a normal ring oscillator and the triggered reference ring oscillator may be no worse than a Vernier TDC for phase noise. Although the example in FIG. 3B, docks the samples on a rising edge, the sample may also be docked on a negative edge.

In another example, the period of the Ref. Ring OSC, $T_{ref.ring}$, can be set to $(9/8)T_{vco}$, which can work in a similar manner to the example of FIG. 3B, but where the time difference between the VCO signal 106 rising edge and the Ref. Ring OSC signal rising edge increases by $(1/8)T_{vco}$ every cycle. Since TDC measures the negative of the phase difference (when $T_{ref.ring}$ is set to $(9/8)T_{vco}$), the PLL may flip the polarity of the phase comparison to correct for the negative of the phase difference.

The ring oscillator period can be shorter or longer than the VCO period. The ring oscillator period $T_{ref.ring}$ can be represented by $(N_s \pm 1)/N_s \cdot T_{vco}$, where $T_{vco}$ is the VCO period, $N_s$ is a TDC sample number, and the TDC sample number is a positive integer of samples per the VCO period. For a re-circulating TDC with a resolution of B-bits, the TDC sample number $N_s$ can represented by $2^B$. For a B-bit re-circulating TDC, $T_{ref.ring}$ can be set to $(2^B \pm 1)/2^B \cdot T_{vco}$ and ring oscillator period may be automatically adjusted with respect to the ADPLL VCO frequency. Without loss of generality, $T_{ref.ring}$ can be set to $(2^B-1)/2^B \cdot T_{vco}$. In another example (not described), $(2^B+1)/2^B \cdot T_{vco}$ may be used. By monitoring an instantaneous VCO period $T_{pn}$ normalized to the TDC resolution $(T_{vco}/2^B)$, the ring oscillator period $T_{ref.ring}$ can be adjusted to a correct value. The operations to set the correct value for $T_{ref.ring}$ can easily be performed in digital domain.

Figure 4A:
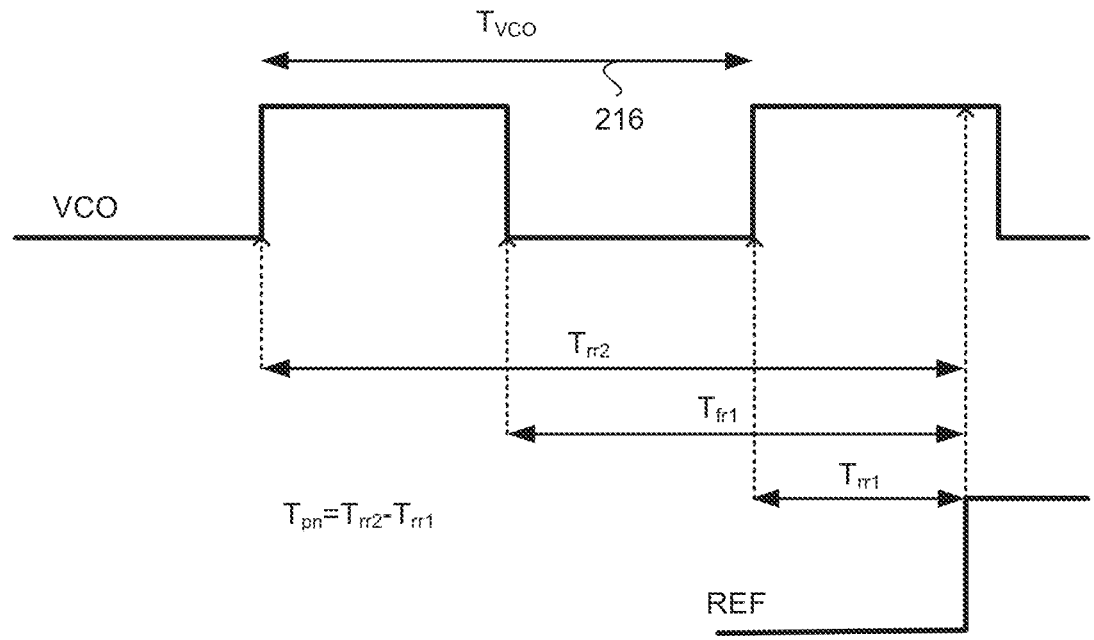
FIG. 4A illustrates a timing diagram of a periodic ring oscillator signal measurement of a reference ring oscillator using the rising edge of a voltage-controlled oscillator (VCO) signal in accordance with an example.
Figure 4B:
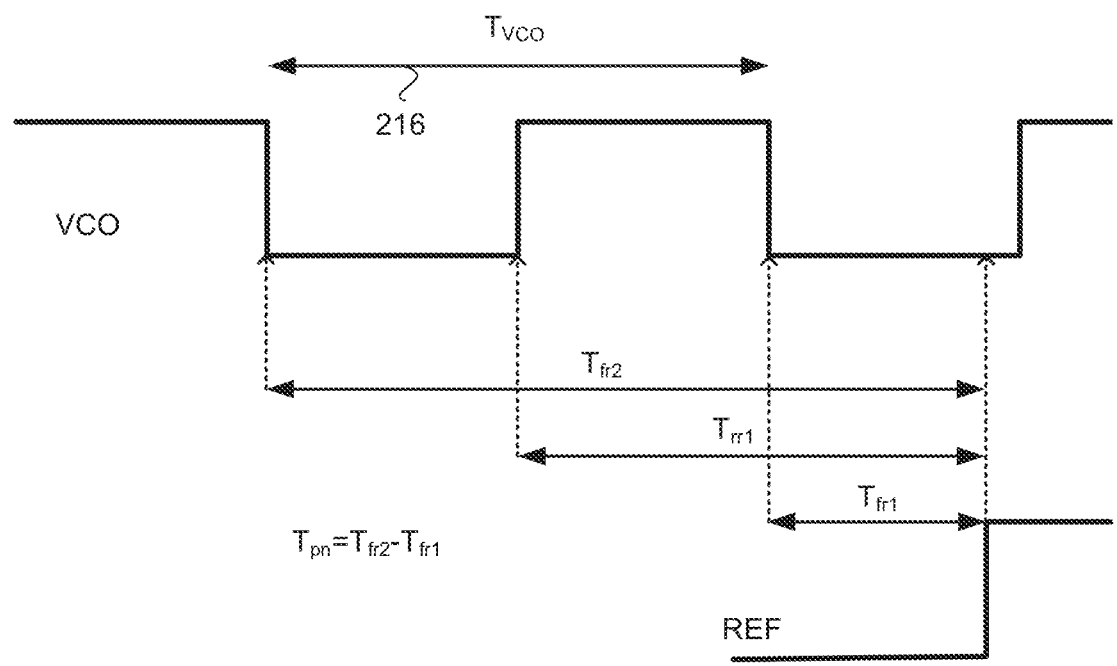
FIG. 4B illustrates a timing diagram of a periodic ring oscillator signal measurement of a reference ring oscillator using the falling edge of a voltage-controlled oscillator (VCO) signal in accordance with an example.

By quantizing three consecutive VCO edges, $T_{pn}$ can be estimated. FIG. 4A illustrates three VCO edges of the VCO signal 216, including two rising edges ($T_{rr2}$, $T_{rr1}$) and one falling edge ($T_{fr1}$) relative to a reference edge used to generate instantaneous VCO period $T_{pn}$. When two VCO rising edges are detected, $T_{pn}$ can be obtained from the difference of the quantized rising edge locations ($T_{rr2}-T_{rr1}$). FIG. 4B illustrates three VCO edges, including two falling edges ($T_{fr2}$, $T_{fr1}$) and one rising edge ($T_{rr1}$) relative to a reference edge. When two VCO falling edges are detected, $T_{pn}$ can be obtained, in a similar manner, from the difference of the quantized falling edge locations ($T_{fr2}-T_{fr1}$). For the measurement of the instantaneous VCO period $T_{pn}$, 1.5 VCO cycles may be used, corresponding to $(N_s+(N_s/2))$ ring oscillator periods $T_{ref.ring}$ (e.g., at least $(N_s+(N_s/2))$) latches in a delay module or shift register) for a specified resolution, where $N_s$ is a TDC sample number or samples per the VCO period. When the TDC sample number $N_s$ can represented by $2^B$, the number of ring oscillator periods $T_{ref.ring}$ (e.g., cycles) or latches in a delay module (e.g., a shift register) may be represented by $(2^B+2^{B-1})$. For example, a 6-bit re-circulating TDC can use 96 cycles or latches to determine the $T_{pn}$ and the $T_{pn}$ can have a value of 64.

Figure 5:
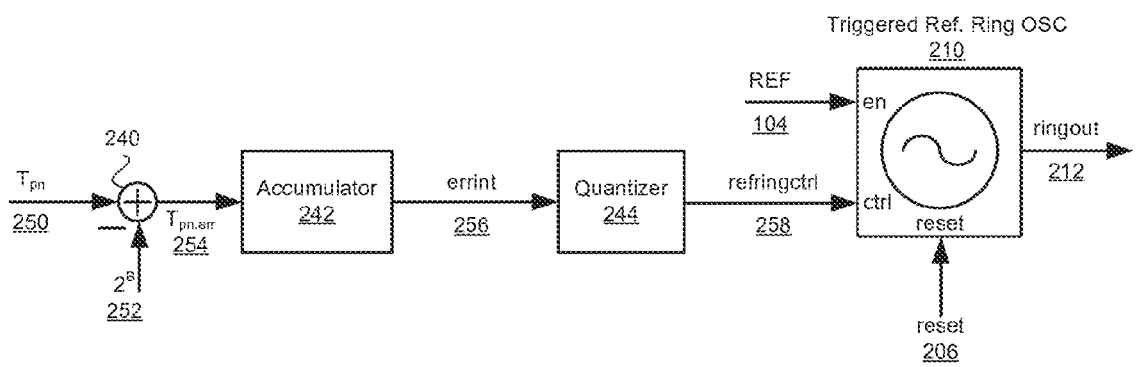
FIG. 5 illustrates a block diagram of a digital frequency lock module for a re-circulating time-to-digital converter (TDC) in accordance with an example.

FIG. 5 illustrates a digital frequency locking module for the triggered reference ring oscillator 210 of the re-circulating TDC. The digital frequency lock module can include an adder 240, an accumulator 242, and a quantizer 244. The adder can subtract a measured TDC sample number $N_s$ (e.g., $2^B$ 252 when the TDC sample number $N_s$ is represented by $2^B$) from an instantaneous VCO period $T_{pn}$ 250 normalized to a TDC resolution to generate a VCO period normalized error $T_{pn.err}$ 254. The accumulator can generate an integrated error errint 256 by integrating the VCO period normalized error $T_{pn.err}$. The quantizer can generate the ring oscillator control signal refringctrl 258 by mapping the integrated error to a control setting. The quantizer can be a digital signal processor for mapping a large set of input values to a smaller set of value, such as rounding values to some unit of precision. The quantizer can truncate the least significant bits (LSB) of the integrated error, which may increase quantization error because the number of bits used to map the number of bits of the integrated error may be reduced to the number of control bits for the ring oscillator control signal. In another example, the measured $T_{pn}$ can be subtracted by $2^B$ and the resulting $T_{pn.err}$ can be integrated by the accumulator. The quantizer can truncate the LSBs of the accumulator output, errint, and the quantizer output, refringctrl, can adjust $T_{ref.ring}$. The closed loop of the digital frequency locking module in the re-circulating TDC can force the value of $T_{pn}$ to become $N_s$ (e.g., $2^B$) and the re-circulating TDC to have 6bit resolution when the TDC sample number $N_s$ is represented by $2^B$.

Figure 6A:
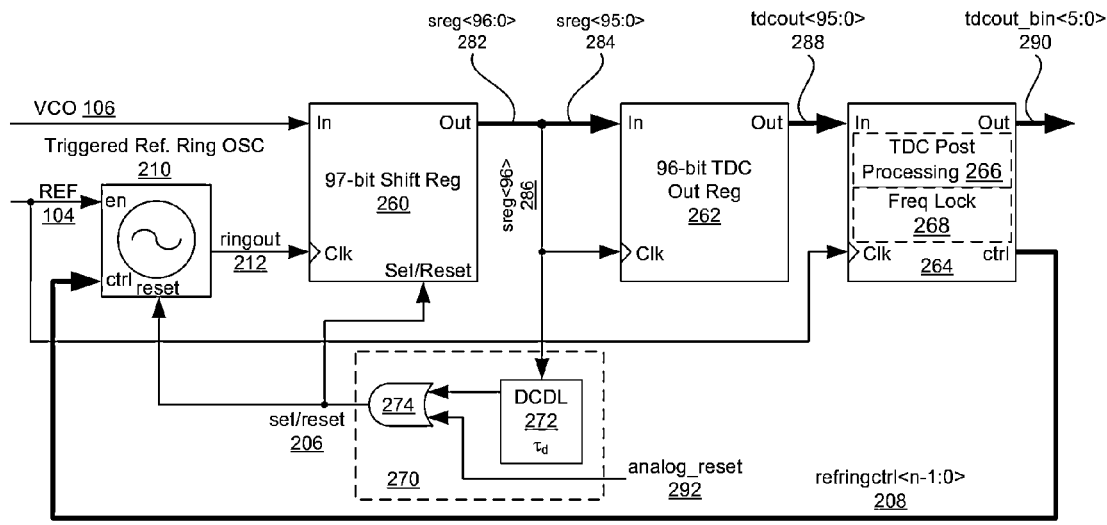
FIG. 6A illustrates a block diagram of a re-circulating time-to-digital converter (TDC) in accordance with an example.

FIG. 6A illustrates an example architecture of a re-circulating TDC with a 6-bit resolution. In an example, the re-circulating TDC can include a triggered reference ring oscillator 210 and a delay module, such as a shift register 260. In another example, the re-circulating TDC can include a triggered reference ring oscillator 210 and a digital frequency lock module 268. FIG. 6 illustrates a re-circulating TDC with a triggered reference ring oscillator 210 (i.e., triggered Ref. Ring OSC), a delay module (e.g., a 97-bit shift register 260), an output module (e.g., a 96-bit TDC output register 262), a TDC post processing and frequency lock loop module 264, and a reset module 270.

The triggered reference ring oscillator 210 can include an enable input, a control input, a set/reset input, and an output. The enable input can allow a signal, such as the reference signal REF 104, to trigger the reference ring oscillator to generate a periodic ring oscillator signal ringout 212 on the output. The control input refringctrl 208 can sets the ring oscillator period for the triggered reference ring oscillator. The set/reset input can set the initial reference ring oscillator signal to a specified value, such a logic low.

The delay module can include a data input, a dock input, a set/reset input, and a plurality of outputs. The data input of the delay module can be coupled to the VCO signal 106, where the VCO signal can provide an input for a first latch sreg<0>. The delay module can be configured as a serial-in, parallel-out (SIPO) shift register. The 97-bit shift register 260 can include 97 latches (e.g., flip-flops), where each latch can generate an output sreg<96:0> 282. The set/reset input can initialize each of latches to a specified state, such a 0000 . . . 0001 (sreg<96:0> of FIG. 6B). Each latch of the shift register can latch in the input with an edge (e.g., a rising edge or a falling edge) of a dock input signal, such as the ringout signal. In another example, the number of latches for the delay module can be at least 1.5 times the TDC sample number, where the TDC sample number is a positive integer of samples per VCO period. For example, the TDC sample number can be 64, so the number of latches for the delay module can be at least 96. One additional latch can be added to the delay module to dock the output module and generate a reset signal, so the number of latches for the delay module can be at least 97 (i.e., $(N_s+(N_s/2))+1$). Other additional latches can be used in the delay module, but the additional latches may be redundant without improving the performance of the re-circulating TDC.

The output module can include a plurality of inputs, a dock input, and a plurality of outputs. The output module can be configured as a parallel-in, parallels out (PIPO) register. The 96-bit TDC output register 262 can include 96 latches (e.g., flip-flops), where each latch can generate an output tdcout<95:0> 288 from an input sreg<95:0> 284. Each latch of the output module can latch in the input with an edge (e.g., a rising edge or a falling edge) of a dock input signal, such as the sreg<96> 286 signal. In another example, the number of latches for the output module can be at least 1.5 times the TDC sample number, where the TDC sample number is a positive integer of samples per VCO period. For example, the TDC sample number can be 64, so the number of latches for the output module can be at least 96 (i.e., ($N_s$+($N_s$/2))). Additional latches can be used hi the output module, but the additional latches may be redundant without improving the performance of the re-circulating TDC.

In another example, the output module configured to output the samples of the plurality of latches of the delay module. The outputs can be latched after a sampling time interval. The sampling time interval can be a VCO period normalized time interval plus a state transition time interval. The VCO period normalized time interval can correspond to the instantaneous VCO period $T_{pn}$ normalized to the TDC resolution. The state transition time interval can correspond to the offset between an edge of the VCO signal and an edge of the reference signal after the instantaneous VCO period $T_{pn}$. The VCO period normalized time interval can be substantially the TDC sample number times the VCO period, where the TDC sample number can be a positive integer of samples per VCO period. The state transition time interval can be a variable time interval (represented by a positive integer of samples) after the VCO period normalized time interval when a specified latch transitions to a different digital state.

The TDC post processing and frequency lock loop module 264 can include a digital frequency lock module 268 and a TDC post-process module 266. The digital frequency lock module and the TDC post-process module is shown as a single module, but the digital frequency lock module and the TDC post-process module can be separate modules, components, or circuits. The digital frequency lock module can include a plurality of inputs, a dock input, and a plurality of control signal outputs. The digital frequency lock module can generate a ring oscillator control signal refringctrl 208 from the samples of VCO signal docked with the periodic ring oscillator signal ringout 212, where the samples can be stored it the output module and the samples can provide an input tdcout<95:0> 288 to the digital frequency lock module. The ring oscillator control signal can set the ring oscillator period for the triggered reference ring oscillator. The digital frequency lock module can generate a new ring oscillator control signal with an edge (e.g., a rising edge or a falling edge) of a dock input signal, such as the REF 104 signal.

The TDC post-process module 266 can include a plurality of inputs, a dock input, and a plurality of outputs. A TDC post-process module can generate a TDC output tdout_bin<5:0> 290 (e.g., 6-bit binary output), where the TDC output is a binary representation of a phase difference between a reference signal and a VCO signal. The TDC post-process module can generate a TDC output tdout_bin<5:0> from the samples of VCO signal docked with the periodic ring oscillator signal ringout 212, where the samples can be stored in the output module and the samples can provide an input tdcout<95:0> 288 to the TDC post-process module. The TDC post-process module can generate a new binary representation with an edge (e.g., a rising edge or a falling edge) of a dock input signal, such as the REF 104 signal.

The reset module 270 can include a digitally controlled delay line (DCDL) 272 and a digital gate, such as an OR 274, AND, NAND, or NOR gate. The reset module can generate a set/reset signal 206 to instruct the triggered reference ring oscillator to cease docking the periodic ring oscillator signal, reset an oscillator output to a predetermined state, and/or set the latches of the delay module to a predetermined state. In an example, the oscillator output can be reset to logic low. In another example, the reset module can reset the triggered reference ring oscillator and the delay module. Each latch of the delay module is set to a predetermined state when the delay module is reset. The triggered reference ring oscillator may be set to a predetermined state when the triggered reference ring oscillator is reset. The DCDL can generate a reset signal when a specified latch from the delay module transitions to a different digital state. For example, a specified latch signal, such as the sreg<96> 286 signal, from the specified latch can generate an edge (e.g., a rising edge or a falling edge) or state for a reset signal. In another example, the specified latch can be a most significant bit (MSB) of the plurality of latches of the delay module, as illustrated in FIG. 3A. The DCDL can include a delay element or delay cell with a predetermined or specified delay rd. The digital gate can generate a reset signal from the DCDL or an external reset command analog_reset 292 received external to the re-circulating TDC. The reset signal can instruct the triggered reference ring oscillator to cease docking the periodic ring oscillator signal.

Figure 6B:
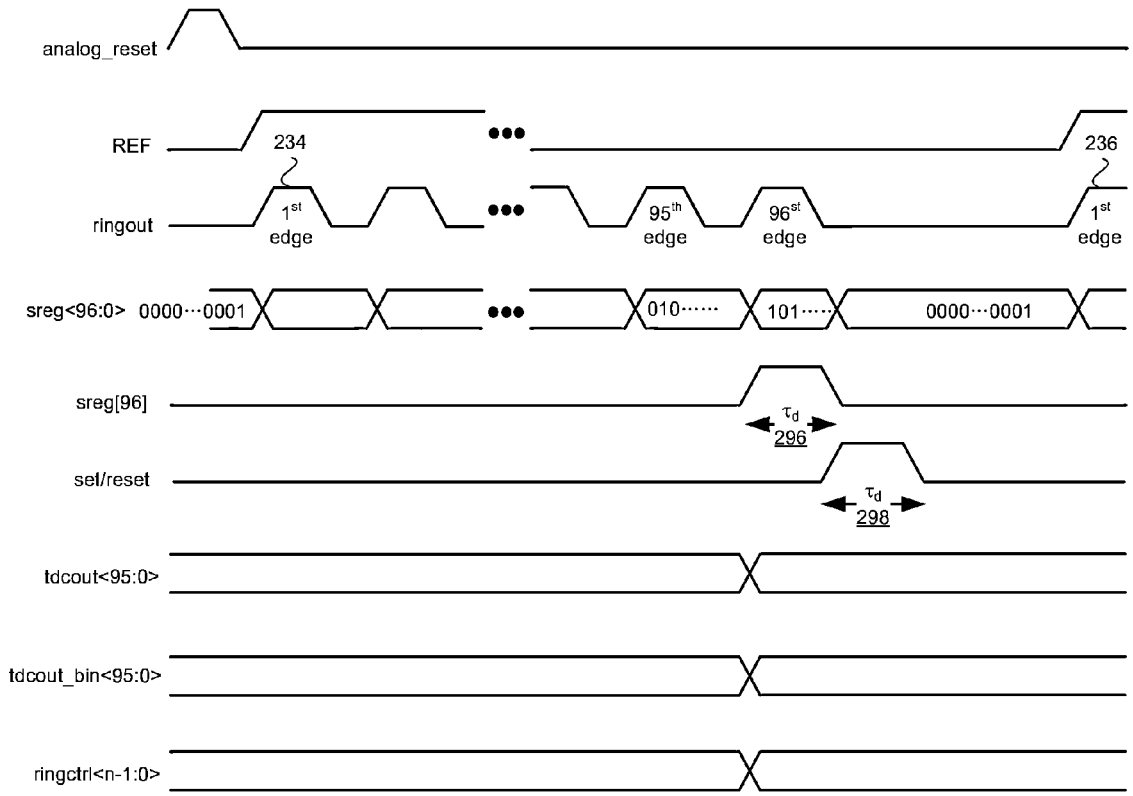
FIG. 6B illustrates a timing diagram for a re-circulating time-to-digital converter (TDC) in accordance with an example.

FIG. 6B shows an example timing diagram for the example re-circulating TDC of FIG. 6A. In the example, an analog_reset can disable the triggered Ref. Ring OSC and can set the shift register output sreg<96:0> to 00000 . . . 0001, When the REF signal has a rising edge, the triggered Ref. Ring OSC output ringout can start oscillating 234 and a least significant bit (LSB) latch (e.g., FF) of the shift register can compare a VCO phase with a ringout phase. As the ringout signal progates, the LSB latch output can be shifted in ascending order and at the 96th ringout cycle, sreg<96> signal can transition from a logic low to a logic high (e.g., a digital "0" to a digital "1"). The sreg<95:0> can be stored in the TDC output register. The output tdcout<95:0> of the TDC out register can be position decoded in the TDC post-process module into a binary TDC output tdout_bin<5:0> and used for the frequency locking in the digital frequency lock module. The sreg<96> signal can also be applied to the DCDL, and the DCDL output set/reset can disable the triggered Ref. Ring OSC and reset the shift register latch outputs sreg<96:0> to 00000 . . . 0001. As a result of the reset, the re-circulating TDC can be set for a next VCO phase quantization 236. In an example, the sreg<96> signal pulse width can be controlled by a delay amount $\tau_d$ 296 in the shift register. The set/reset signal pulse width can be controlled by a delay amount $\tau_d$ 298 in the DCDL, which can reduce a race condition in the shift register and/or spike in the set/reset signal pulse. The embedded counting and set-reset configuration of the re-circulating TDC can eliminate a high-speed gray counter used in other types of TDCs, such as Vernier TDCs. The elimination of the high-speed gray counter can result in a reduction of power consumption and silicon area. Although, modules are illustrated to transition (or dock) on rising edges, in other examples (not shown) the modules can be docked by falling edges. Signal pulses in FIG. 6B are illustrated as a logic low signal pulsed to a logic high and returning to a logic low, in other example (not shown) signal pulses can also include a logic high signal pulsed to a logic low and returning to a logic high. In some examples, normally logic low signals can consume less power than normally logic high signals.

To speed up an initial frequency acquisition, the reference ring oscillator can be characterized at a few discrete tuning settings by triggering the reference ring oscillator and measuring the frequency of oscillation through a counter. The frequency measurement can be performed in production testing or on a power up of the reference ring oscillator and stored on a memory (e.g., a read-only memory [ROM] or a random access memory [RAM]). From settings derived from frequency measurements, an initial estimation for a desired channel frequency can be interpolated. The initial estimation and interpolation can reduce the amount of time used for a frequency locking loop to converge. The re-circulating TDC may also prevent a feedback loop of a reference ring control signal 208 and/or a feedback loop of a PPL from locking to the other stable equilibrium point of $(2^B+1)/2^B \cdot T_{vco}$, which can also be used when the phase measurements are inverted. The Ref. Ring OSC output ringout can be sampled on quadrature phases of the VCO in a quadri-correlator to determine which of the two frequencies (i.e., a VCO signal frequency or a periodic ring oscillator signal frequency) is higher and maintaining one signal frequency higher than the other signal frequency. For example, the re-circulating TDC can reset $T_{ref.ring}$ to a minimum delay setting if $T_{ref.ring}$ drifts to become larger than $T_{vco}$.

In another embodiment, the re-circulating TDC can include a tuning module (or initialization module) (not shown) for interpolating a desired VCO frequency and/or reducing a time for the triggered reference ring oscillator to converge on the desired VCO frequency. The tuning module can include a memory and/or a quadri-correlator. The memory can store discrete initialization tuning settings for the triggered reference ring oscillator. The quadri-correlator can determine a polarity of a frequency difference between the VCO signal and the periodic ring oscillator signal and can maintain one signal frequency, either a VCO signal frequency or a periodic ring oscillator signal frequency, higher than the other signal frequency.

Figure 7A:
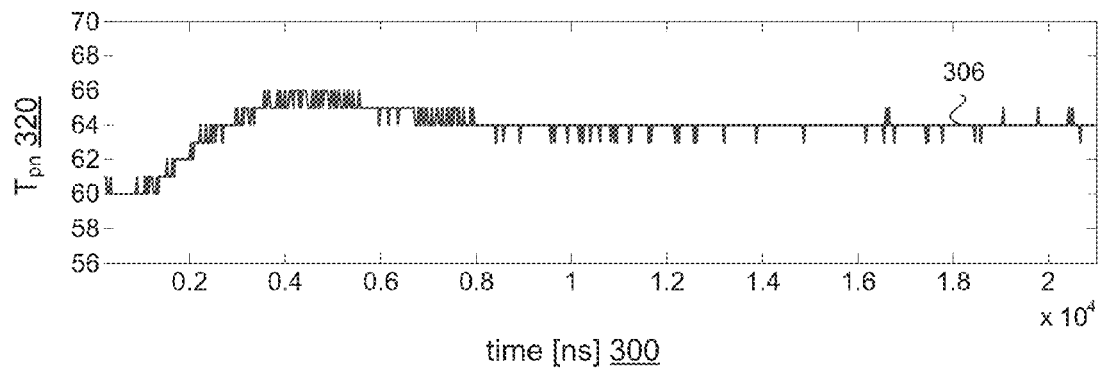
FIG. 7A illustrates a graph of transient simulation results of instantaneous VCO period $T_{pn}$ normalized to a TDC resolution of an all-digital phase locked loop (ADPLL) including a re-circulating time-to-digital converter (TDC) in accordance with an example.
Figure 7B:
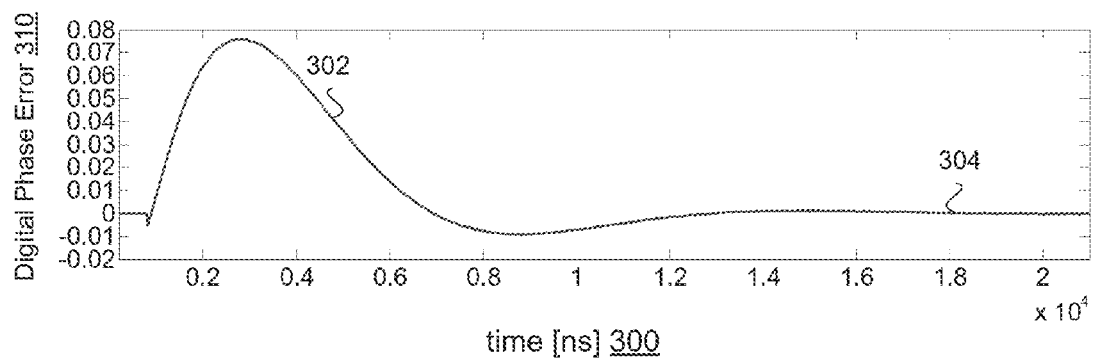
FIG. 7B illustrates a graph of transient simulation results of digital phase error of an all-digital phase locked loop (ADPLL) including a re-circulating time-to-digital converter (TDC) hi accordance with an example.
Figure 8:
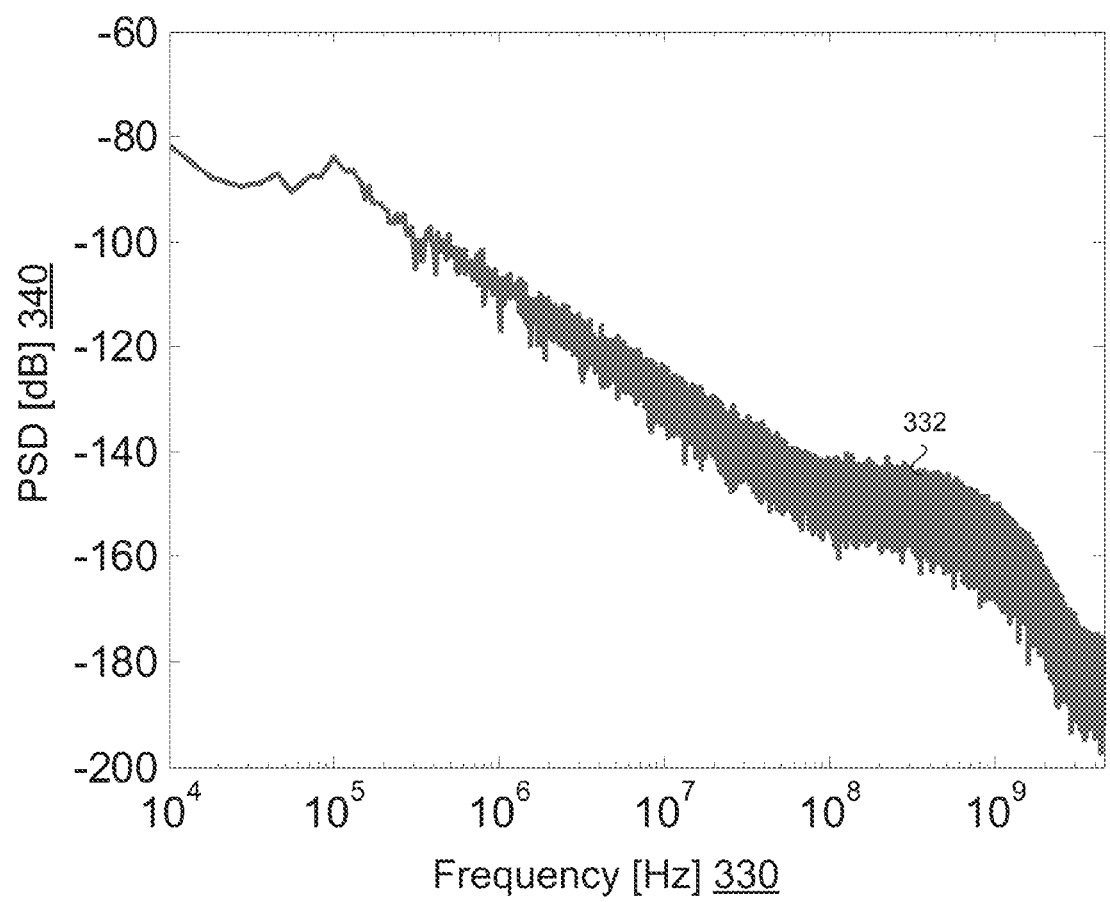
FIG. 8 illustrates a graph of an all-digital phase locked loop (ADPLL) phase noise simulation result, where the ADPLL includes a re-circulating time-to-digital converter (TDC) in accordance with an example.

FIG. 7A shows example transient simulation results of an instantaneous VCO period $T_{pn}$ 320 normalized to a TDC resolution of an ADPLL using re-circulating TDC. In an example, a fractional frequency command word can be set to 1/64. The TDC output can increment or decrement by one to appear like a stair case. The VCO period normalized by the TDC resolution, $T_{pn}$, can converge over time 300 to 64 (306). In an example, the digital phase error 310 measurement can also have an initial error 302 that converges over time 300 to zero 304, as illustrated in FIG. 7B. FIG. 8 shows an example phase noise simulation of the ADPLL of the power spectral density (PSD) 340 in decibels (dB) relative to frequency 330 in hertz (Hz). The power spectral density can be used as a measurement for spectral purity. Spectral purity can be a quantification of the variation 332 of a frequency of a given electrical signal sample. The graph show no tones (i.e., signal spurs) due to the re-circulating TDC, which can be caused by fractional TDC nonlinearity (associated with other types of TDCs).

In an example, the power of the re-circulating TDC can be reduced by a factor of 3 and the area can be reduced by a factor of 4 compared to a Vernier TDC with non-linearity calibration implemented on the same process.

The re-circulating TDC can be used in wireless radio transceivers for high data-rate standards, such as a third generation partnership project (3GPP) long term evolution (LTE) standard (e.g., 4G(LTE)/5G(LTE-Advanced) cellular), a WiMAX (Worldwide interoperability for Microwave Access or the Institute of Electrical and Electronics Engineers (IEEE) 802.16 standard (e.g., 802.16e, 802.16m)), and a WiFi (IEEE 802.11 standard). The re-circulating TDC can be used to generate a radio frequency (RF). The re-circulating TDC used in both stand-alone radios or as part of a system-on-chip (SoC) incorporating one or more wireless protocol. Within a transceiver, the re-circulating TDC can be used in an all digital frequency synthesizer for local oscillator (LO) generation forming a linear transceiver. The re-circulating TDC can also be used in a wireless digital transmitter for phase modulation.

In another example, the re-circulating TDC can re-use a single delay cell (e.g., the triggered Ref. Ring OSC) and a flip-flop for time comparison. Through the re-use of the same elements, the re-circulating TDC can achieve linear characteristics with much smaller area and power consumption compared with a conventional TDC, such as a Vernier TDC. In another example, the frequency locking module of the re-circulating TDC can track the VCO frequency in real time so that the TDC performance may not degrade, even with PVT variations. The re-circulating TDC can be more robust to PVT variations (minimize the sensitivity to PVT variations) and transistor model inaccuracies than other types of TDCs. The frequency locking module of the re-circulating TDC may be easily designed from a hardware description language. The embedded counting in the re-circulating TDC may not use a high-speed counter, which can reduce power consumption and silicon area. The re-circulating TDC can be used with a voltage-controlled oscillator (VCO), a local oscillator (LO), a delay-locked loop (DLL), a phase-locked loop (PLL), a quadrature VCO, a frequency divider, or a combination of the listed components. A re-circulating TDC can be fabricated with a digital CMOS process.

The re-circulating TDC can enable area efficient, low-power, scalable and PVT insensitive digital PLLs by creating a linear TDC through re-using the same delay element. Saving silicon area can reduce the cost of fabricating the re-circulating TDC, in another example, the re-circulating TDC can include a triggered ring oscillator and digital logic, which can allow the re-circulating TDC to be synthesizable, and thus design and development cost as well as the time-to-market can be reduced. The re-circulating TDC can be a high resolution TDC, a mismatch immune TDC, or a mismatch insensitive TDC, where the mismatch is between delay cells or delay elements (used in other types of TDCs) for the VCO signal or the reference signal.

In example (a delay module re-circulation TDC example), a re-circulating time-to-digital converter (TDC) can include a triggered reference ring oscillator (TRRO) and a delay module. The triggered reference ring oscillator can, when triggered by a reference signal edge, generate a periodic ring oscillator signal with a ring oscillator period that is a selected ratio of a voltage-controlled oscillator (VCO) period. The delay module can store, in a plurality of latches, samples of a VCO signal docked by the periodic ring oscillator signal. Each latch can generate an output of the sample, and each latch output can represent a time difference polarity between VCO signal and TRRO signal. The delay module can be configured as a shift register or the plurality of latches to form a cascade of flip flops, but other mechanisms which provide similar functionality may also be used. Each of the samples of the VCO dock can include digital state information. The number of latches in the delay module can be at least 1.5 times the TDC sample number. The TDC sample number can be a positive integer of samples per VCO period.

In another example (a frequency lock re-circulation TDC example), the re-circulating TDC can include the triggered reference ring oscillator, a digital frequency lock module, and a TDC post-process module. The triggered reference ring oscillator can, when triggered by a reference signal edge, generate a periodic ring oscillator signal with a ring oscillator period that is a selected ratio of a voltage-controlled oscillator (VCO) period. The digital frequency lock module can generate a ring oscillator control signal, which sets the ring oscillator period for the triggered reference ring oscillator. The TDC post-process module can generate a TDC output, which can be a binary representation of a phase difference between a reference signal and a VCO signal.

In an embodiment of both the delay module re-circulation TDC example and the frequency lock re-circulation TDC example, the ring oscillator period can be shorter than the VCO period, and the ring oscillator period $T_{ref.ring}$ can be represented by $(N_s-1)/N_s*T_{vco}$, where $T_{vco}$ is the VCO period, $N_s$ is a TDC sample number, and the TDC sample number is a positive integer of samples per the VCO period. In another embodiment of both examples, the ring oscillator period can be longer than the VCO period, and the ring oscillator period $T_{ref.ring}$ can be represented by $(N_s+1)/N_s*T_{vco}$, where $T_{vco}$ is the VCO period, $N_s$ is a TDC sample number, and the TDC sample number is a positive integer of samples per the VCO period. In another embodiment of both examples, the ring oscillator period can be substantially within one TDC sample width of a voltage-controlled oscillator (VCO) period, where the TDC sample width is one over a TDC sample number Ns times the VCO period, and the TDC sample number is a positive integer of samples per VCO period. The re-circulating TDC can have a resolution of B-bits, where the TDC sample number $N_s$ is represented by $2^B$.

In another embodiment of the delay module re-circulation TDC example, the re-circulating TDC can further include an output module configured to output the samples of the plurality of latches of the delay module. The outputs can be latched after a sampling time interval. The sampling time interval can be a VCO period normalized time interval plus a state transition time interval. The VCO period normalized time interval can be substantially the TDC sample number times the VCO period, where the TDC sample number can be a positive integer of samples per VCO period. The state transition time interval can be a variable time interval after the VCO period normalized time interval when a specified latch transitions to a different digital state. In another embodiment of the delay module re-circulation TDC example, the re-circulating TDC can further include a digital frequency lock module and a TDC post-process module. The digital frequency lock module can generate a ring oscillator control signal, where the ring oscillator control signal sets the ring oscillator period for the triggered reference ring oscillator. A TDC post-process module can generate a TDC output, where the TDC output is a binary representation of a phase difference between a reference signal and a VCO signal.

In another embodiment of both the delay module re-circulation TDC example and the frequency lock re-circulation TDC example, the digital frequency lock module can generate an instantaneous VCO period $T_{pn}$ normalized to a TDC resolution and a VCO period normalized error $T_{pn.err}$ from the outputs of the output module, where the VCO period normalized error is a TDC sample number $N_s$ subtracted from the instantaneous VCO period, and the TDC sample number $N_s$ is a positive integer of samples per VCO period. In another embodiment of both examples, the digital frequency lock module can include an adder, an accumulator, and a quantizer. The adder can subtract a TDC sample number $N_s$ from an instantaneous VCO period $T_{pn}$ normalized to a TDC resolution to generate a VCO period normalized error $T_{pn.err}$, where the TDC sample number $N_s$ is a positive integer of samples per VCO period. The accumulator can generate an integrated error by integrating the VCO period normalized error $T_{pn.err}$. The quantizer can generate the ring oscillator control signal by mapping the integrated error to a control setting. The quantizer can truncate the least significant bits (LSB) of the integrated error, which may increase quantization error because the number of bits used to map the number of bits of the integrated error may be reduced to the number of control bits for the ring oscillator control signal.

In another embodiment of both the delay module re-circulation TDC example and the frequency lock re-circulation TDC example, the triggered reference ring oscillator can be configured to cease clocking the periodic ring oscillator signal and reset an oscillator output with a reset signal. In an example, the oscillator output can be reset to logic low. In another embodiment of both examples, the re-circulating TDC can include a reset module configured to reset the triggered reference ring oscillator and a delay module, where each latch of the delay module is set to a predetermined state when the delay module is reset. The triggered reference ring oscillator may be set to a predetermined state when the triggered reference ring oscillator is reset. The reset module can include a digitally controlled delay line (DCDL) and a digital gate, such as an OR gate. The DCDL can generate a reset signal when a specified latch from the delay module transitions to a different digital state. The digital gate can generate a reset signal from the DCDL or an external reset command received external to the re-circulating TDC. The reset signal can instruct the triggered reference ring oscillator to cease clocking the periodic ring oscillator signal. The specified latch can be a most significant bit (MSB) of the plurality of latches of the delay module.

In another embodiment of both the delay module re-circulation TDC example and the frequency lock re-circulation TDC example, the re-circulating TDC can include a tuning module configured to interpolate a desired VCO frequency and reduce a time for the triggered reference ring oscillator to converge on the desired VCO frequency. The tuning module can include a memory and/or a quadri-correlator. The memory can store discrete initialization tuning settings for the triggered reference ring oscillator. The quadri-correlator can determine a polarity of a frequency difference between the VCO signal and the periodic ring oscillator signal and can maintain one signal frequency, either a VCO signal frequency or a periodic ring oscillator signal frequency, higher than the other signal frequency.

In another embodiment of both the delay module re-circulation TDC example and the frequency lock re-circulation TDC example, the re-circulating TDC can be configured in a phase locked loop (PLL) to generate a clock frequency within a band of an Institute of Electrical and Electronics Engineers (IEEE) 802.11 standard, IEEE 802.16 standard, and third generation partnership project (3GPP) long term evolution (LTE) standard. In another embodiment of both examples, the re-circulating TDC can be included in a mobile device configured to connect to at least one of a wireless local area network (WLAN), a wireless personal area network (WPAN), and a wireless wide area network (WWAN). The mobile device can include an antenna, a touch sensitive display screen, a speaker, a microphone, a graphics processor, an application processor, internal memory, a non-volatile memory port, or combinations these components.

Figure 9:
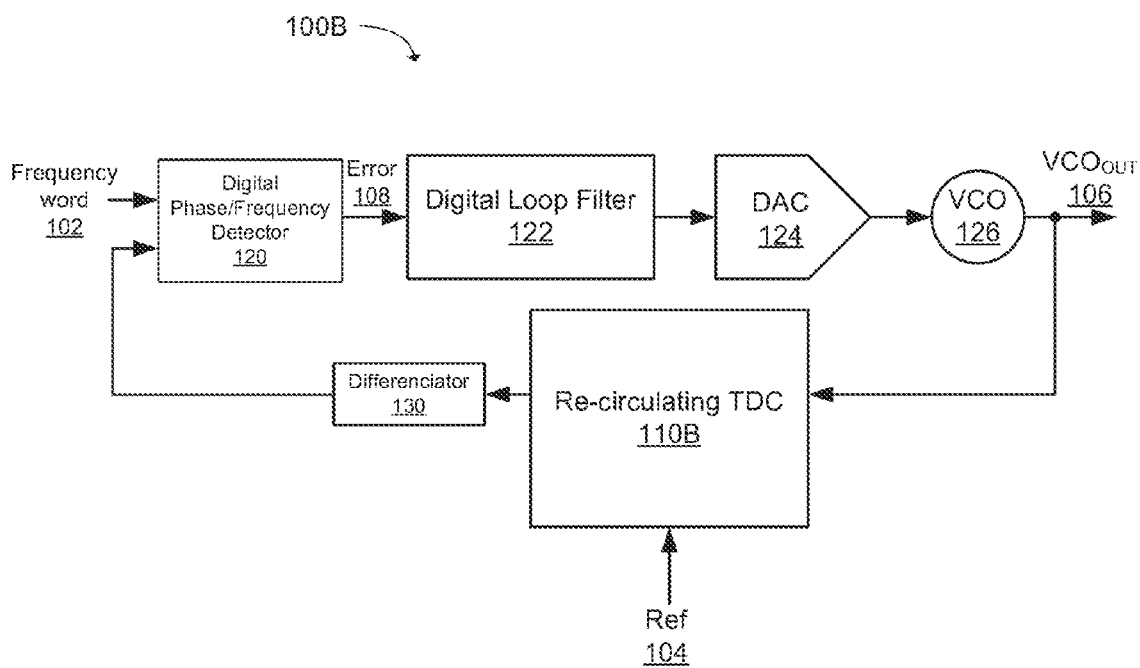
FIG. 9 illustrates a block diagram of an all-digital phase locked loop (ADPLL) including a re-circulating time-to-digital converter (TDC) in accordance with an example.

In another example, an all-digital phase locked loop (AD-PLL) 100B can include a digital phase/frequency detector 120, a digital loop filter 122, a digital-to-analog converter (DAC) 124, a voltage-controlled oscillator (VCO) 126, a re-circulating TDC 110B, and a differenciator 130, as illustrated in FIG. 9. The digital phase/frequency detector can integrate frequency error 108 by comparing a frequency word input to a differentiated TDC output in a feedback loop which can be proportional to a frequency difference between the frequency word 102 and the differentiated TDC output. The digital loop filter can generate a filtered phase error signal by low-pass filtering the phase error signal. The DAC can convert the filtered phase error signal into a voltage input for a VCO. The VCO can generate a periodic VCO signal 106 at a specified frequency, where the voltage input can be used to converge the VCO frequency to the specified frequency. The re-circulating TDC can be configured in any of the examples previously described to generate a TDC output signal from the VCO signal 106 and the reference signal 104. The differenciator can generate the differentiated TDC output by differentiating the TDC output signal.

Figure 10:
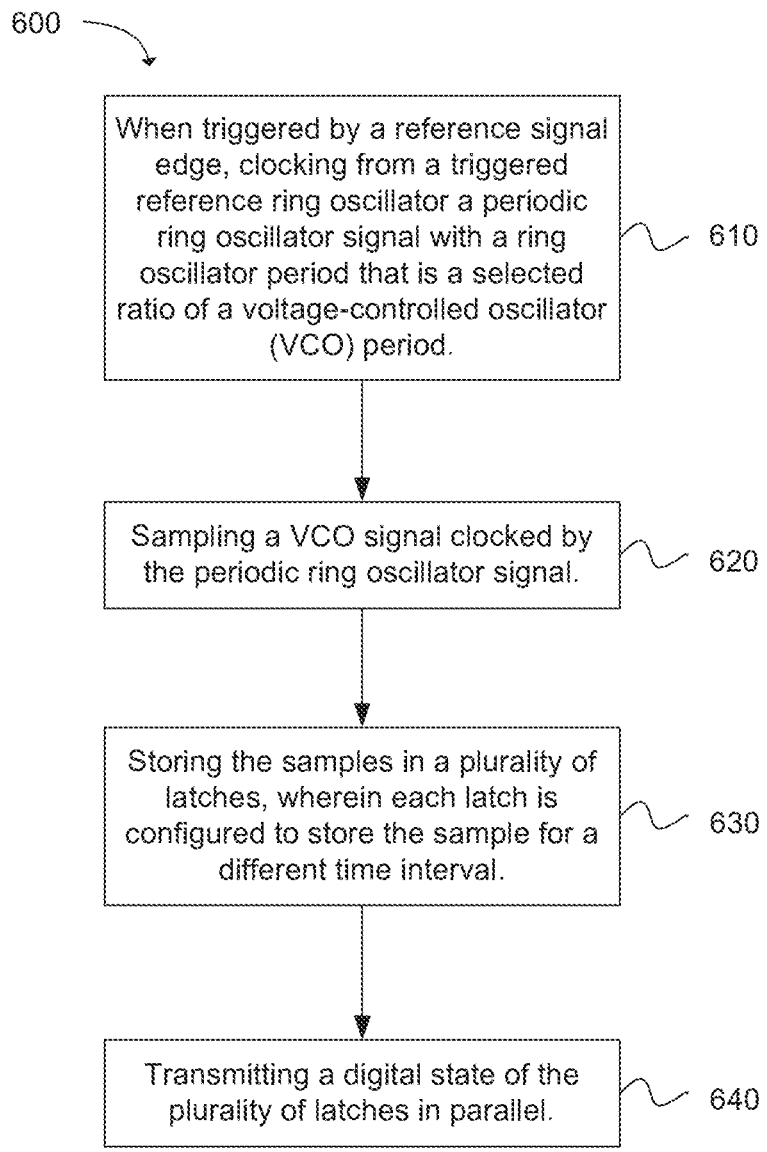
FIG. 10 depicts a flow chart of a method for time-to-digital conversion in accordance with an example.

Another example provides a method 600 for time-to-digital conversion using a triggered reference ring oscillator, as shown in the flow chart in FIG. 10. The method may be executed as instructions on a machine, where the instructions are included on at least one computer readable medium or machine readable medium. The computer readable medium may be a non-transitory computer readable storage medium. The machine readable medium may be a non-transitory machine readable storage medium. The method includes the operation of, when triggered by a reference signal edge, clocking from a triggered reference ring oscillator a periodic ring oscillator signal with a ring oscillator period that is a selected ratio of a voltage-controlled oscillator (VCO) period, as in block 610. The operation of sampling a VCO signal clocked by the periodic ring oscillator signal follows, as in block 620. The next operation of the method can be storing the samples in a plurality of latches, wherein each latch is configured to store the sample for a different time interval, as in block 630. The method further includes transmitting a digital state of the plurality of latches in parallel, as in block 640.

The method can further include latching the digital state of the plurality of latches, including the samples of the VCO signal, after a sampling time interval. The sampling time interval can be a VCO period normalized time interval plus a state transition time interval. The VCO period normalized time interval can be substantially the TDC sample number times the VCO period, and the TDC sample number can be a positive integer of samples per VCO period. The state transition time interval can be a variable time interval after the VCO period normalized time interval when a specified latch transitions to a different digital state. In another example, the method can further include generating a TDC output from the latched the digital state. The TDC output can be a binary representation of a phase difference between a reference signal and the VCO signal. The method can further include generating a ring oscillator control signal from the latched the digital state. The ring oscillator control signal can set the ring oscillator period for the triggered reference ring oscillator. In another example, the method can further include stopping the docking of the periodic ring oscillator signal when a specified latch from the plurality of latches transitions to a different digital state. The method can further include resetting each latch of the plurality of latches to a predetermined state when the specified latch from the plurality of latches transitions to a different digital state. The method can further include resetting an oscillator output of the triggered reference ring oscillator to a predetermined or specified state, such as logic low, when the specified latch from the plurality of latches transitions to a different digital state. The method can further include initially tuning the triggered reference ring oscillator to a frequency substantially dose to a desired VCO frequency to reduce a time for the triggered reference ring oscillator to converge on a desired TRRO frequency. The plurality of latches can be configured as at least one of a shift register and a cascade of flip flops. The ring oscillator period can be substantially within one TDC sample width of a voltage-controlled oscillator (VCO) period. The TDC sample width can be one over a TDC sample number $N_s$ times the VCO period. The TDC sample number can be a positive integer of samples per VCO period. In an example, the ring oscillator period can be shorter than the VCO period and the ring oscillator period $T_{ref.ring}$ is represented by $(N_s-1)/N_s*T_{vco}$, where $T_{vco}$ is the VCO period and $N_s$ is a TDC sample number. In another example, the ring oscillator period can be longer than the VCO period and the ring oscillator period $T_{ref.ring}$ is represented by $(N_s+1)/N_s*T_{vco}$, where $T_{vco}$ is the VCO period, $N_s$ is a TDC sample number.

Figure 11:
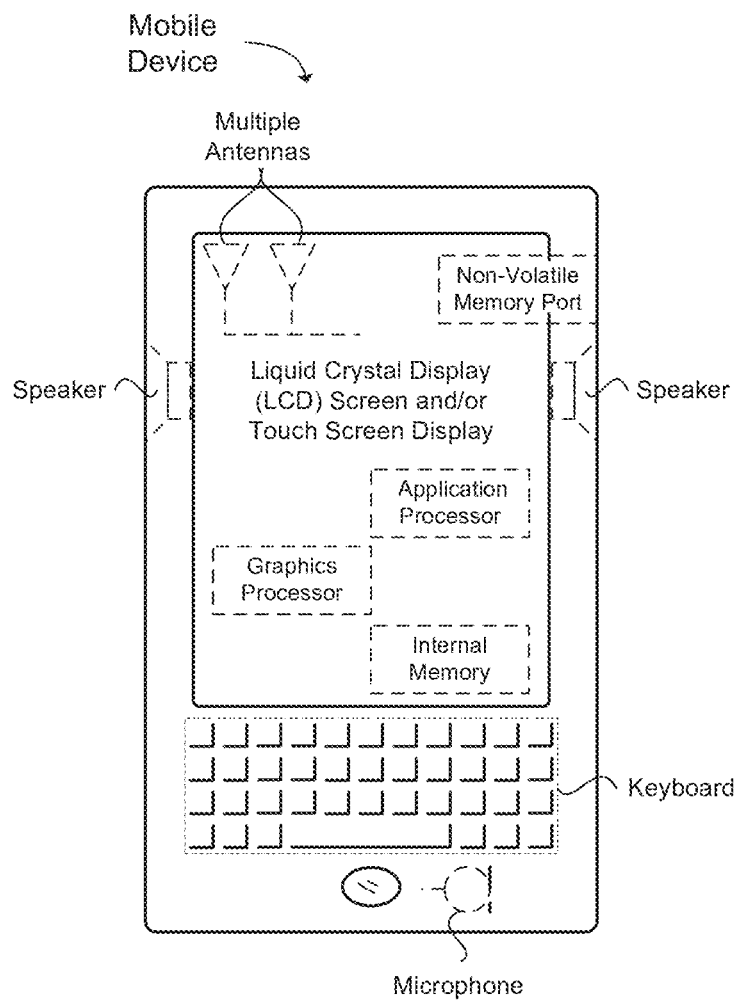
FIG. 11 illustrates a diagram of a mobile device in accordance with an example.

In another example, the re-circulating time-to-digital converter (TDC) or the all-digital phase locked loop (ADPLL) can be included in a mobile device or a transmission station. FIG. 11 provides an example illustration of a mobile device, such as a user equipment (UE), a mobile station (MS), a mobile wireless device, a mobile communication device, a tablet, a handset, or other type of mobile wireless device. The mobile device can include one or more antennas configured to communicate with transmission station, such as a base station (BS), an evolved Node B (eNB), or other type of wireless wide area network (WWAN) access point. The mobile device can be configured to communicate using at least one wireless communication standard including third generation partnership project (3GPP) long term evolution (LTE), WiMAX (Worldwide interoperability for Microwave Access or the Institute of Electrical and Electronics Engineers (IEEE) 802.16 standard (e.g., 802.16e, 802.18m)), High Speed Packet Access (HSPA), Bluetooth, and WiFi (IEEE 802.11 standard). The mobile device can communicate using separate antennas for each wireless communication standard or shared antennas for multiple wireless communication standards. The mobile device can communicate in a wireless local area network (WLAN), a wireless personal area network (WPAN), and/or a WWAN.

FIG. 11 also provides an illustration of a microphone and one or more speakers that can be used for audio input and output from the mobile device. The display screen may be a liquid crystal display (LCD) screen, or other type of display screen such as an organic light emitting diode (OLED) display. The display screen can be configured as a touch screen. The touch screen may use capacitive, resistive, or another type of touch screen technology. An application processor and a graphics processor can be coupled to internal memory to provide processing and display capabilities. A non-volatile memory port can also be used to provide data input/output options to a user. The non-volatile memory port may also be used to expand the memory capabilities of the mobile device. A keyboard may be integrated with the mobile device or wirelessly connected to the mobile device to provide additional user input. A virtual keyboard may also be provided using the touch screen.

Various techniques, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computer, the machine becomes an apparatus for practicing the various techniques. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a RAM, EPROM, flash drive, optical drive, magnetic hard drive, or other medium for storing electronic data. The base station and mobile station may also include a transceiver module, a counter module, a processing module, and/or a dock module or tinier module. One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

It should be understood that many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Reference throughout this specification to "an example" means that a particular feature, structure, or characteristic described in connection with the example is included in at least one embodiment of the present invention. Thus, appearances of the phrases "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A re-circulating time-to-digital converter (TDC), comprising:
    a triggered reference ring oscillator (TRRO) configured, when triggered by a reference signal edge, to generate a periodic ring oscillator signal with a ring oscillator period that is a selected ratio of a voltage-controlled oscillator (VCO) period; and
    a delay module configured to store, in a plurality of latches, samples of a VCO signal clocked by the periodic ring oscillator signal, wherein each latch is configured to generate an output of the sample, and each latch output represents a time difference polarity between the VCO signal and the periodic ring oscillator signal.

2. The re-circulating TDC of claim 1, wherein the delay module is configured as at least one of a shift register and the plurality of latches to form a cascade of flip flops, and each of the samples of the VCO clock includes digital state information.

3. The re-circulating TDC of claim 1, wherein the number of latches is at least 1.5 times the TDC sample number, and the TDC sample number is a positive integer of samples per VCO period.

4. The re-circulating TDC of claim 1, wherein the ring oscillator period is shorter than the VCO period, and the ring oscillator period $T_{ref.fing}$ is represented by $(N_s-1)/N_s*T_{vco}$ is the VCO period, $N_s$ is a TDC sample number, and the TDC sample number is a positive integer of samples per the VCO period.

5. The re-circulating TDC of claim 1, wherein the ring oscillator period is longer than the VCO period, and the ring oscillator period $T_{ref.ring}$ is represented by $(N_s+1)/N_s*T_{vco}$, where $T_{vco}$ is the VCO period, $N_s$ is a TDC sample number, and the TDC sample number is a positive integer of samples per the VCO period.

6. The re-circulating TDC of claim 1, wherein the ring oscillator period is substantially within one TDC sample width of a voltage-controlled oscillator (VCO) period, wherein the TDC sample width is one over a TDC sample number $N_s$ times the VCO period, and the TDC sample number is a positive integer of samples per VCO period.

7. The re-circulating TDC of claim 6, wherein the re-circulating TDC has a resolution of B-bits, and the TDC sample number $N_s$ is represented by $2^B$.

8. The re-circulating TDC of claim 1, further comprising an output module configured to output the samples of the plurality of latches of the delay module, wherein the outputs are latched after a sampling time interval, where the sampling time interval is a VCO period normalized time interval plus a state transition time interval, where the VCO period normalized time interval is substantially the TDC sample number times the VCO period, the TDC sample number is a positive integer of samples per VCO period, and the state transition time interval is a variable time interval after the VCO period normalized time interval when a specified latch transitions to a different digital state.

9. The re-circulating TDC of claim 8, further comprising:
a digital frequency lock module configured to generate a ring oscillator control signal, wherein the ring oscillator control signal sets the ring oscillator period for the triggered reference ring oscillator; and
a TDC post-process module configured to generate a TDC output, wherein the TDC output is a binary representation of a phase difference between a reference signal and a VCO signal.

10. The re-circulating TDC of claim 1, wherein the triggered reference ring oscillator is configured to cease clocking the periodic ring oscillator signal and reset an oscillator output with a reset signal.

11. The re-circulating TDC of claim 1, further comprising a reset module configured to reset the triggered reference ring oscillator and a delay module, wherein each latch of the delay module is set to a predetermined state when the delay module is reset, and the reset module further comprises:
a digitally controlled delay line (DCDL) configured to generate a reset signal when a specified latch from the delay module transitions to a different digital state; and
a digital gate configured to generate a reset signal from the DCDL or an external reset command received external to the re-circulating TDC, wherein the reset signal instructs the triggered reference ring oscillator to cease clocking the periodic ring oscillator signal.

12. The re-circulating TDC of claim 11, wherein the specified latch is a most significant bit (MSB) of the plurality of latches of the delay module.

13. The re-circulating TDC of claim 1, further comprising a tuning module configured to interpolate a desired VCO frequency and reduce a time for the triggered reference ring oscillator to converge on the desired VCO frequency.

14. The re-circulating TDC of claim 13, wherein the tuning module further comprises:
a memory configured to store discrete initialization tuning settings for the triggered reference ring oscillator; and
a quadri-correlator configured to determine a polarity of a frequency difference between the VCO signal and the periodic ring oscillator signal and maintain one signal frequency, either a VCO signal frequency or a periodic ring oscillator signal frequency, higher than the other signal frequency.

15. The re-circulating TDC of claim 1, wherein the re-circulating TDC is configured in a phase locked loop (PLL) to generate a clock frequency within a band of an Institute of Electrical and Electronics Engineers (IEEE) 802.11 standard, IEEE 802.16 standard, and third generation partnership project (3GPP) long term evolution (LTE) standard.

16. The re-circulating TDC of claim 1, wherein the re-circulating TDC is included in a mobile device configured to connect to at least one of a wireless local area network (WLAN), a wireless personal area network (WPAN), and a wireless wide area network (WWAN), wherein the mobile device includes an antenna, a touch sensitive display screen, a speaker, a microphone, a graphics processor, an application processor, internal memory, a non-volatile memory port, or combinations thereof.

17. An all-digital phase locked loop (ADPLL), comprising:
a digital phase/frequency detector configured to integrate frequency error by comparing a frequency word input to a differentiated TDC output in a feedback loop which is proportional to a frequency difference between the frequency word and the differentiated TDC output;
a digital loop filter configured to generate a filtered phase error signal by low-pass filtering the phase error signal;
a digital-to-analog converter (DAC) configured to convert the filtered phase error signal into a voltage input for a VCO;
the VCO configured to generate a periodic VCO signal at a specified frequency, wherein the voltage input is used to converge the VCO frequency to the specified frequency;
the re-circulating TDC of claim 1, configured to generate a TDC output signal from the VCO signal and the reference signal; and
a differenciator configured to generate the differentiated TDC output by differentiating the TDC output signal.

18. A re-circulating time-to-digital converter (TDC), comprising:
a triggered reference ring oscillator (TRRO) configured, when triggered by a reference signal edge, to generate a periodic ring oscillator signal with a ring oscillator period that is a selected ratio of a voltage-controlled oscillator (VCO) period;
a digital frequency lock module configured to generate a ring oscillator control signal, wherein the ring oscillator control signal sets the ring oscillator period for the triggered reference ring oscillator; and
a TDC post-process module configured to generate a TDC output, wherein the TDC output is a binary representation of a phase difference between a reference signal and a VCO signal.

19. The re-circulating TDC of claim 18, wherein the ring oscillator period is substantially within one TDC sample width of a voltage-controlled oscillator (VCO) period, wherein the TDC sample width is one over a TDC sample number $N_s$ times the VCO period, and the TDC sample number is a positive integer of samples per VCO period.

20. The re-circulating TDC of claim 18, wherein the digital frequency lock module is further configured to generate an instantaneous VCO period $T_{pn}$ normalized to a TDC resolution and a VCO period normalized error $T_{pn.err}$ from the outputs of the output module, wherein the VCO period normalized error is a TDC sample number $N_s$ subtracted from the instantaneous VCO period, and the TDC sample number $N_s$ is a positive integer of samples per VCO period.

21. The re-circulating TDC of claim 18, wherein the digital frequency lock module further comprises:
an adder configured to subtract a TDC sample number $N_s$ from an instantaneous VCO period $T_{pn}$ normalized to a TDC resolution to generate a VCO period normalized error $T_{pn.err}$, wherein the TDC sample number $N_s$ is a positive integer of samples per VCO period;
an accumulator configured to generate an integrated error by integrating the VCO period normalized error $T_{pn.err}$; and
a quantizer configured to generate the ring oscillator control signal by mapping the integrated error to a control setting.

22. The re-circulating TDC of claim 21, wherein the quantizer is configured to truncate the least significant bits (LSB) of the integrated error.

23. An all-digital phase locked loop (ADPLL), comprising:
a digital phase/frequency detector configured to integrate frequency error by comparing a frequency word input to a differentiated TDC output in a feedback loop which is proportional to a frequency difference between the frequency word and the differentiated TDC output;

a digital loop filter configured to generate a filtered phase error signal by low-pass filtering the phase error signal;

a digital-to-analog converter (DAC) configured to convert the filtered phase error signal into a voltage input for a VCO;

the VCO configured to generate a periodic VCO signal at a specified frequency, wherein the voltage input is used to converge the VCO frequency to the specified frequency;

the re-circulating TDC of claim 18, configured to generate a TDC output signal from the VCO signal and the reference signal; and a differenciator configured to generate the differentiated TDC output by differentiating the TDC output signal.

24. A method for time-to-digital conversion, comprising:

when triggered by a reference signal edge, clocking from a triggered reference ring oscillator a periodic ring oscillator signal with a ring oscillator period that is a selected ratio of a voltage-controlled oscillator (VCO) period;

sampling a VCO signal clocked by the periodic ring oscillator signal;

storing the samples in a plurality of latches, wherein each latch is configured to store the sample for a different time interval; and transmitting a digital state of the plurality of latches in parallel.

25. The method of claim 24, further comprising:

latching the digital state of the plurality of latches, including the samples of the VCO signal, after a sampling time interval, where the sampling time interval is a VCO period normalized time interval plus a state transition time interval, where the VCO period normalized time interval is substantially the TDC sample number times the VCO period, the TDC sample number is a positive integer of samples per VCO period, and the state transition time interval is a variable time interval after the VCO period normalized time interval when a specified latch transitions to a different digital state.

26. The method of claim 25, further comprising:

generating a TDC output from the latched the digital state, wherein the TDC output is a binary representation of a phase difference between a reference signal and the VCO signal; and generating a ring oscillator control signal from the latched the digital state, wherein the ring oscillator control signal sets the ring oscillator period for the triggered reference ring oscillator.

27. The method of claim 24, further comprising:

stopping the clocking of the periodic ring oscillator signal when a specified latch from the plurality of latches transitions to a different digital state; and resetting each latch of the plurality of latches to a predetermined state when the specified latch from the plurality of latches transitions to a different digital state.

28. The method of claim 24, wherein the ring oscillator period is substantially within one TDC sample width of a voltage-controlled oscillator (VCO) period, wherein the TDC sample width is one over a TDC sample number $N_s$ times the VCO period, and the TDC sample number is a positive integer of samples per VCO period.

29. The method of claim 24, wherein the ring oscillator period is shorter than the VCO period and the ring oscillator period $T_{ref.ring}$ is represented by $(N_s-1)/N_s*T_{vco}$ or the ring oscillator period is longer than the VCO period and the ring oscillator period $T_{ref.ring}$ is represented by $(N_s+1)/N_s*T_{vco}$ is the VCO period, $N_s$ is a TDC sample number, and the TDC sample number is a positive integer of samples per the VCO period.

30. At least one non-transitory machine readable storage medium comprising a plurality of instructions adapted to be executed to implement the method according to claim 24.

* * * * *